(12) United States Patent
Yamamoto

(10) Patent No.: US 9,011,637 B2
(45) Date of Patent: Apr. 21, 2015

(54) PLASMA PROCESSING APPARATUS AND METHOD OF MANUFACTURING SEMICONDUCTOR DEVICE

(75) Inventor: Takashi Yamamoto, Nirasaki (JP)

(73) Assignee: Tokyo Electron Limited (JP)

( * ) Notice: Subject to any disclaimer, the term of this patent is extended or adjusted under 35 U.S.C. 154(b) by 216 days.

(21) Appl. No.: 13/106,441

(22) Filed: May 12, 2011

(65) Prior Publication Data

US 2011/0287631 A1    Nov. 24, 2011

Related U.S. Application Data

(60) Provisional application No. 61/348,545, filed on May 26, 2010.

(30) Foreign Application Priority Data

May 12, 2010 (JP) ................................ 2010-109958

(51) Int. Cl.
| | |
|---|---|
| *C23F 1/00* | (2006.01) |
| *H01L 21/306* | (2006.01) |
| *H01J 37/32* | (2006.01) |
| *H01L 21/687* | (2006.01) |

(52) U.S. Cl.
CPC ..... *H01J 37/32642* (2013.01); *H01J 37/32568* (2013.01); *H01J 37/32577* (2013.01); *H01J 37/32715* (2013.01); *H01L 21/68742* (2013.01)

(58) Field of Classification Search
USPC .......... 118/715, 722, 723 R, 723 E, 728, 729; 156/345.43–345.47, 345.51, 345.54
See application file for complete search history.

(56) References Cited

U.S. PATENT DOCUMENTS

| | | | | |
|---|---|---|---|---|
| 5,542,559 | A  * | 8/1996 | Kawakami et al. | ............. 216/67 |
| 5,964,947 | A  * | 10/1999 | Zhao et al. | .................... 118/715 |
| 6,949,165 | B2 * | 9/2005 | Koshimizu | ............... 156/345.44 |
| 2003/0201069 | A1 * | 10/2003 | Johnson | ................... 156/345.43 |
| 2004/0149389 | A1 | 8/2004 | Fink | |

(Continued)

FOREIGN PATENT DOCUMENTS

| | | |
|---|---|---|
| CN | 101322237 | 12/2008 |
| JP | 2003-293138 | 10/2003 |

(Continued)

*Primary Examiner* — Maureen Gramaglia
(74) *Attorney, Agent, or Firm* — Cantor Colburn LLP

(57) ABSTRACT

A plasma processing apparatus and a method of manufacturing a semiconductor device which can prevent a discharge from occurring between a substrate such as a semiconductor wafer or the like, and a base material of a lower electrode or a peripheral structure of the base material, and can improve yield and productivity. The plasma processing apparatus includes a processing chamber, a lower electrode, an upper electrode, and a plurality of lifter pins for supporting a substrate to be processed. Each of the lifter pins includes a pin body part and a lid part which is disposed on a top portion of the pin body part and has an outer diameter greater than an outer diameter of the pin body part. The lower electrode includes through-holes for lifter pins each of which includes a pin body receiving part, which has an inner diameter less than the outer diameter of the lid part and receives the pin body part, and a lid receiving part, which is formed in an upper portion of the pin body receiving part and receives the cover portion, and in which the lifter pins are disposed. In a state where the lifter pins are lowered, the lid part is received in the lid receiving part, and the upper portion of the pin body receiving part is blocked by the lid part.

4 Claims, 5 Drawing Sheets

(56) References Cited

U.S. PATENT DOCUMENTS

| | | | |
|---|---|---|---|
| 2006/0254717 A1* | 11/2006 | Kobayashi et al. | 156/345.44 |
| 2008/0194169 A1 | 8/2008 | Sterling et al. | |
| 2008/0236749 A1* | 10/2008 | Koshimizu et al. | 156/345.33 |
| 2009/0041568 A1* | 2/2009 | Muraoka et al. | 414/586 |
| 2011/0253311 A1 | 10/2011 | Muraoka et al. | |

FOREIGN PATENT DOCUMENTS

| | | |
|---|---|---|
| JP | 2003309110 | 10/2003 |
| JP | 2010021405 | 1/2010 |

* cited by examiner

PLASMA PROCESSING APPARATUS AND METHOD OF MANUFACTURING SEMICONDUCTOR DEVICE

CROSS-REFERENCE TO RELATED PATENT APPLICATIONS

This application claims the benefit of Japanese Patent Application No. 2010-109958, filed on May 12, 2010, in the Japan Patent Office and U.S. patent application No. 61/348,545, filed on May 26, 2010, in U.S. Patent and Trademark Office, the disclosures of which are incorporated herein in their entireties by reference.

BACKGROUND OF THE INVENTION

1. Field of the Invention

The present invention relates to a plasma processing apparatus and a method of manufacturing a semiconductor device.

2. Description of the Related Art

Conventionally, in a process of manufacturing a semiconductor device, an apparatus for performing various processes, for example, etching or film forming, on a substrate (for example, a semiconductor wafer) disposed on a holding stage in a processing chamber is used. Also, it is known that the apparatus is provided with a plurality of lifter pins that protrude from the holding stage and can move vertically and support the substrate when the substrate is held on the holding stage in the processing chamber and when the substrate is transferred from the holding stage. (for example, refer to Patent Document 1)

Also, there is known a capacity-coupled plasma processing apparatus where the holding stage in the processing chamber serves as a lower electrode and plasma is generated by applying high-frequency power between the holding stage and an upper electrode disposed to face the holding stage.

[Patent Document 1] Japanese Laid-Open Patent Publication No. 2003-293138

SUMMARY OF THE INVENTION

In a capacity-coupled plasma processing apparatus, a minus bias voltage of up to about −2000 V is generated at a semiconductor wafer or the like exposed to plasma. Meanwhile, since a plus voltage of about +2000 to +2500 V is applied to an electrode of an electrostatic chuck, polarization charges are generated between the electrode of the electrostatic chuck and a base material formed of a conductive metal constituting a holding stage (lower electrode). Since a polarization potential in this case is divided by a high frequency application circuit connected to the base material of the lower electrode, although the polarization potential is determined by a high frequency application circuit constant and a chamber circuit constant, the polarization potential becomes a plus electric potential of up to about +2000 V.

Accordingly, a potential difference of up to about 4000 V may be generated between the semiconductor wafer and the base material of the lower electrode, a discharge (arcing) may occur between the semiconductor wafer, and the base material of the lower electrode or a peripheral structure of the base material, and a semiconductor chip formed on the semiconductor wafer may be damaged. Once the semiconductor chip formed on the semiconductor wafer is damaged, product yield is reduced and productivity is reduced.

The afore-described discharge may be prevented by increasing a withstanding voltage between the semiconductor wafer, and the base material of the lower electrode or the like to, for example, about 5000 V. However, since, for example, through-holes in which lifter pins for lifting the semiconductor wafer are disposed or gas supply holes through which a helium gas or the like for transferring heat between a rear surface of the semiconductor wafer and a surface of the electrostatic chuck, and the like are formed in the lower electrode, it is not easy to increase the withstanding voltage. In particular, a pressure in the through-holes in which the lifter pins are disposed is changed, for example, when a helium gas for cooling is introduced into the through-holes, thereby increasing the risk that a discharge occurs according to Paschen's Law.

To solve the above and/or other problems, the present invention provides a plasma processing apparatus and a method of manufacturing a semiconductor device which can prevent a discharge from occurring between a substrate such as a semiconductor wafer or the like, and a base material of a lower electrode or a peripheral structure of the base material, and which can improve yield and productivity.

According to an embodiment of the present invention, there is provided a plasma processing apparatus including: a processing chamber; a lower electrode which is provided in the processing chamber, includes a base material which is formed of a conductive metal and to which high-frequency power is applied, and serves as a holding stage on which a substrate to be processed is held; an upper electrode which is provided in the processing chamber to face the lower electrode; and a plurality of lifter pins which freely protrude from and retreat into a top surface of the lower electrode and support the substrate to be processed over the lower electrode, wherein each of the lifter pins includes a pin body part and a lid part which is disposed on a top portion of the pin body part and has an outer diameter greater than an outer diameter of the pin body part, wherein the lower electrode includes through-holes for lifter pins each of which includes a pin body receiving part, which has an inner diameter less than the outer diameter of the lid part and receives the pin body part, and a lid receiving part, which is formed in an upper portion of the pin body receiving part and receives the lid part, and in which the lifter pins are disposed, wherein in a state where the lifter pins are lowered, the lid part is received in the lid receiving part, and the upper portion of the pin body receiving part is blocked by the lid part.

According to another embodiment of the present invention, there is provided a method of manufacturing a semiconductor device by performing plasma processing on a substrate to be processed by using a plasma processing apparatus that includes: a processing chamber; a lower electrode which is provided in the processing chamber, includes a base material which is formed of a conductive metal and to which high-frequency power is applied, and serves as a holding stage on which the substrate to be processed is held; an upper electrode which is provided in the processing chamber to face the lower electrode; and a plurality of lifter pins which freely protrude from and retreat into a top surface of the lower electrode and support the substrate to be processed over the lower electrode, the method including: by using the lifter pins each of which includes a pin body part and a lid part which is disposed on a top portion of the pin body part and has an outer diameter greater than an outer diameter of the pin body part, and also by using the lower electrode including through-holes for lifter pins each of which includes a pin body receiving part, which has an inner diameter less than the outer diameter of the lid part and receives the pin body part, and a lid receiving part, which is formed in an upper portion of the pin body receiving part and receives the lid part, and in which the lifter pins are disposed, performing plasma processing in a state where the lifter pins are lowered, the lid part is received in the lid receiving part, and the upper portion of the pin body receiving part is blocked by the lid part.

BRIEF DESCRIPTION OF THE DRAWINGS

The above and other features and advantages of the present invention will become more apparent by describing in detail exemplary embodiments thereof with reference to the attached drawings in which.

EXPLANATION ON REFERENCE NUMARALS

Figure 1:
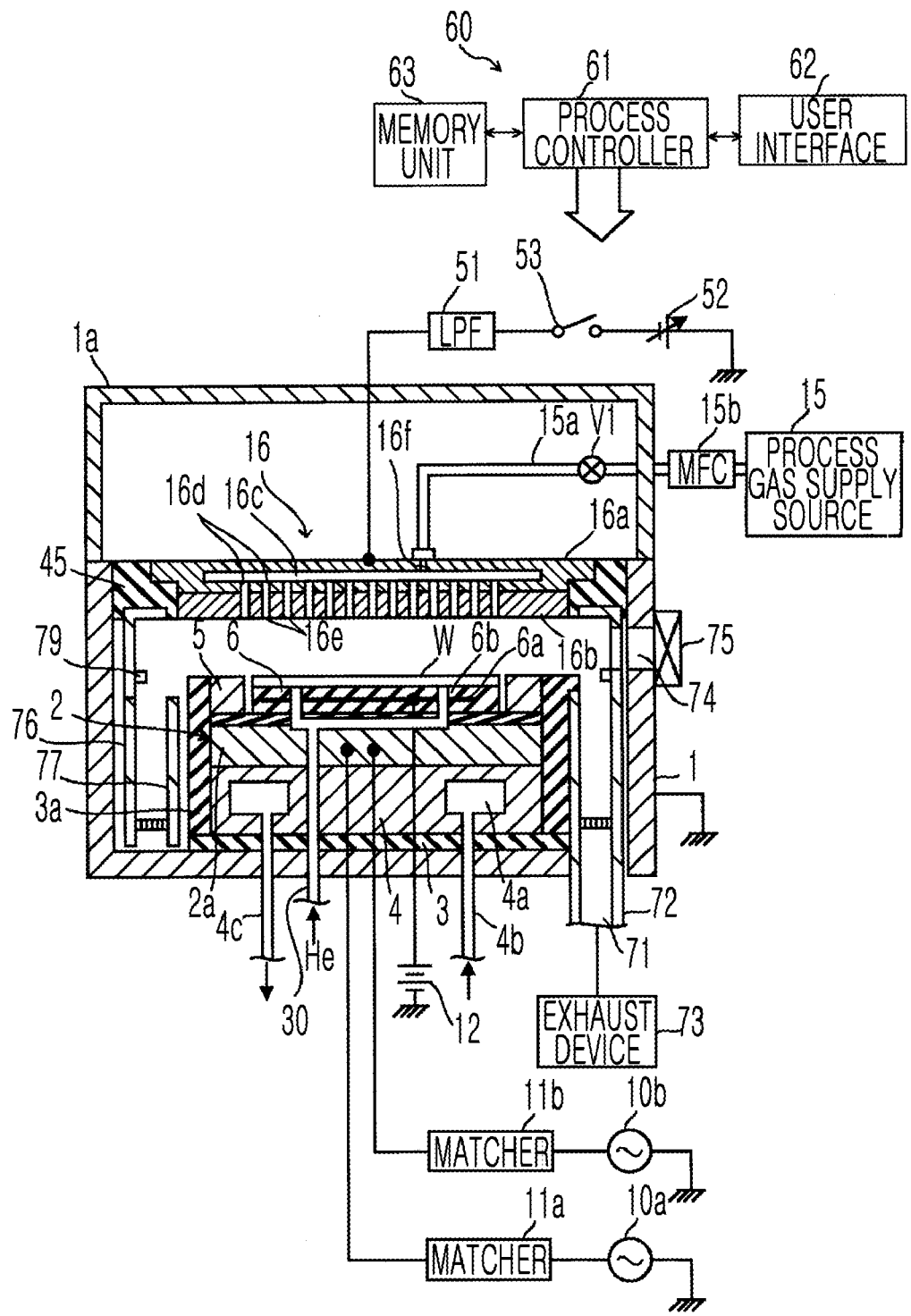
FIG. 1 is a view schematically showing a configuration of a plasma etching apparatus according to an embodiment of the present invention.

W: semiconductor wafer
2: holding stage (lower electrode)
2a : base material
5: focus ring
6a: electrode
6b: insulator
200: through-hole for a lifter pin
201: pin body receiving part
202: lid receiving part
203: tube
210: lifter pin
211: pin body part
212: lid part

DETAILED DESCRIPTION OF THE INVENTION

Hereinafter, embodiments of the present invention will be explained with reference to the drawings. FIG. 1 is a view schematically showing a configuration of a plasma etching apparatus that is a plasma processing apparatus according to an embodiment of the present invention.

The plasma etching apparatus includes a processing chamber 1 that is airtightly configured and electrically grounded. The processing chamber 1 has a cylindrical shape and is formed of, for example, aluminum or the like. A holding stage 2 that horizontally supports a semiconductor wafer that is a substrate to be processed is provided in the processing chamber 1. A base material 2a of the holding stage 2 is formed of a conductive metal, for example, aluminum or the like, and thus functions as a lower electrode. The holding stage 2 is supported on a support plate 4, which is a conductor, with an insulating plate 3 therebetween. Also, a focus ring 5 formed of, for example, monocrystalline silicon is provided along an outer circumference over the holding stage 2. Also, an inner wall member 3a having a cylindrical shape and formed of, for example, quartz, is provided to surround the holding stage 2 and the support plate 4.

A first RF power source 10a is connected through a first matcher 11a to the base material 2a of the holding stage 2, and a second RF power source 10b is also connected through a second matcher 11b to the base material 2a of the holding stage 2. The first RF power source 10a is used to generate plasma, and high-frequency power of a predetermined frequency (equal to or higher than 27 MHz, for example, 40 MHz) is supplied to the base material 2a of the holding stage 2 from the first RF power source 10a. Also, the second RF power source 10b is used to drag ions (for a bias), and high-frequency power of a predetermined frequency (equal to or lower than 13.56 MHz, for example, 3.2 MHz) that is lower than that of the first RF power source 10a is supplied to the base material 2a of the holding stage 2 from the second RF power source 10b. Meanwhile, a shower head 16 functioning as an upper electrode is provided over the holding stage 2 to face the holding stage 2 in parallel to the holding stage 2, and the shower head 16 and the holding stage 2 function as a pair of electrodes (upper electrode and lower electrode).

An electrostatic chuck 6 for electrostatically adsorbing the semiconductor wafer W is provided on a top surface of the holding stage 2. The electrostatic chuck 6 is configured by inserting an electrode 6a into an insulator 6b, and a direct current power source 12 is connected to the electrode 6a. Then, a direct voltage is applied from the direct current power source 12 to the electrode 6a, and thus the semiconductor wafer W is adsorbed due to a Coulomb force.

A coolant passage 4a is formed in the support plate 4, and a coolant inlet pipe 4b and a coolant outlet pipe 4c are connected to the coolant passage 4a. Then, the support plate 4 and the holding stage 2 can be controlled to a predetermined temperature by circulating an appropriate coolant, for example, cooling water or the like, in the coolant passage 4a. Also, a backside gas supply pipe 30 for supplying a gas (backside gas) for cold heat transfer such as a helium gas or the like to a rear surface of the semiconductor wafer W is provided to pass through the holding stage 2 or the like, and the backside gas supply pipe 30 is connected to a backside gas supply source (not shown). In this structure, the semiconductor wafer W adsorbed by the electrostatic chuck 6 onto the top surface of the holding stage 2 can be controlled to a predetermined temperature.

Figure 2:
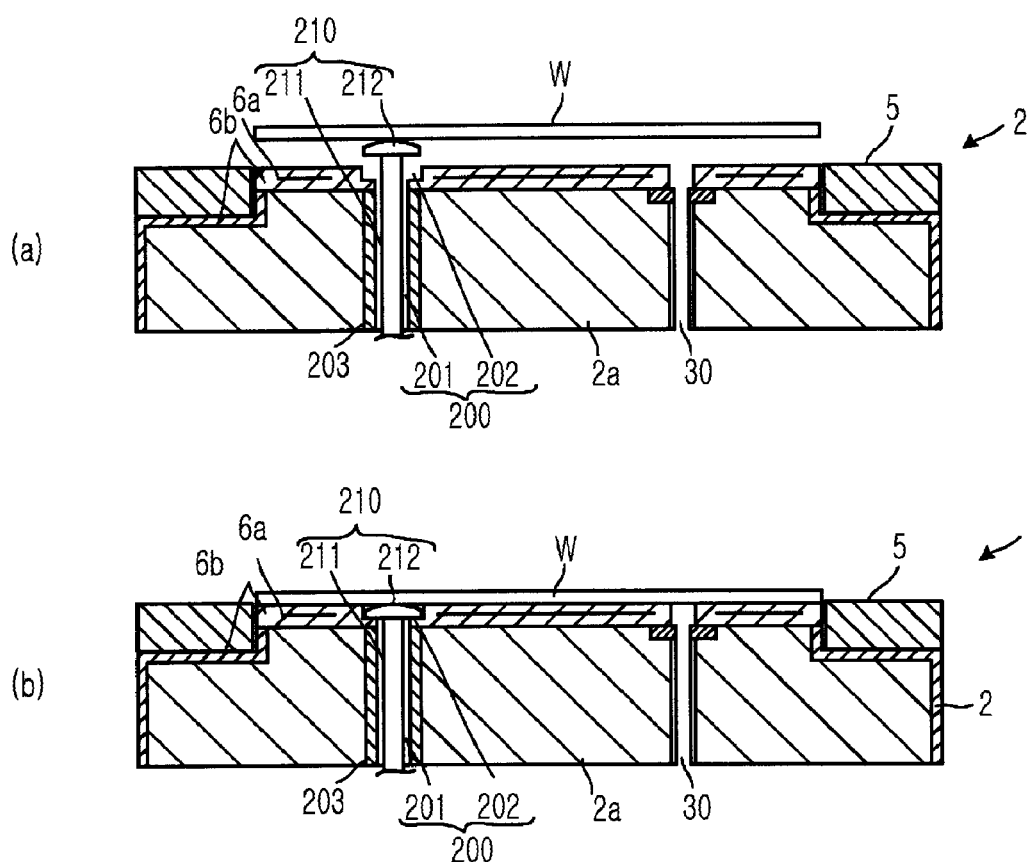
FIG. 2 is a view schematically showing a configuration of main parts of the plasma etching apparatus of FIG. 1.

As shown in FIG. 2, a plurality of, for example, 3, through-holes 200 for lifter pins are formed (only 1 through-hole is shown in FIG. 2), and lifter pins 210 are disposed in the through-holes 200 for lifter pins. Structures of the through-holes 200 for lifter pins and the lifter pins 210 will be explained later.

As shown in FIG. 1, the shower head 16 is provided on a top wall of the processing chamber 1. The shower head 16 may include a body part 16a, and an upper top plate 16b functioning as an electrode plate, and is supported on an upper portion of the processing chamber 1 with an insulating member 45 therebetween. The body part 16a may be formed of a conductive material, for example, aluminum having a surface subjected to anode oxidation and may be configured to support the upper top plate 16 such that the upper top plate 16b is freely attached or detached.

A gas diffusion chamber 16c is provided in the body part 16a, and a plurality of gas passage holes 16d are formed in a lower portion of the body part 16a to be located under the gas diffusion chamber 16c. Also, gas introduction holes 16e passing through the upper top plate 16b in a thickness direction of the upper top plate 16b are formed in the upper top plate 16b to correspond to the gas passage holes 16d. In this configuration, a process gas supplied to the gas diffusion chamber 16c is distributed in a shower shape and supplied into the processing chamber 1 through the gas passage holes 16d and the gas introduction holes 16e. Also, a pipe (not shown) for circulating a coolant is provided on the body part 16a and the like, so that the shower head 16 can be cooled to a desired temperature during plasma etching.

A gas introduction port 16f for introducing a process gas into the gas diffusion chamber 16c is formed in the body part 16a. A gas supply pipe 15a is connected to the gas introduction port 16f, and a process gas supply source 15 for supplying a process gas for etching is connected to another end of the gas supply pipe 15a. A mass flow controller (MFC) 15b and an opening and closing valve V1 are sequentially provided from an upstream side in the gas supply pipe 15a. Then, a process gas for plasma etching is supplied to the gas diffusion chamber 16c through the gas supply pipe 15a from the process gas supply source 15, and is distributed in a shower shape and supplied into the processing chamber 1 through the gas passage holes 16d and the gas introduction holes 16e from the gas diffusion chamber 16c.

A variable direct current power source 52 is electrically connected to the shower head 16 that serves as an upper electrode with a low-pass filter (LPF) 51 therebetween. The variable direct current power source 52 can supply power or cut off power supply by using an on/off switch 53. A current/voltage of the variable direct current power source 52 and an on/off operation of the on/off switch 53 are controlled by a control unit 60 that will be explained later. Also, as will be described later, when plasma is generated in a processing space by applying high frequency waves from the first RF power source 10a and the second RF power source 10b to the holding stage 2, the on/off switch 53 is turned on by the control unit 60 if necessary and thus a predetermined direct voltage is applied to the shower head 16 which serves as an upper electrode.

A ground conductor 1a having a cylindrical shape is disposed to extend upward from a sidewall of the processing chamber 1 above the shower head 16. The ground conductor 1a having the cylindrical shape has a top wall formed on an upper portion thereof.

An exhaust port 71 is formed in a bottom portion of the processing chamber 1, and an exhaust device 73 is connected to the exhaust port 71 through an exhaust pipe 72. The exhaust device 73 has a vacuum pump, and an inside of the processing container 1 may be depressurized to a predetermined degree of vacuum by operating the vacuum pump. Meanwhile, a transfer in/out port 74 for the wafer W is formed in the sidewall of the processing chamber 1, and a gate valve 75 for opening and closing the transfer in/out port 74 is provided in the transfer in/out port 74.

Reference numerals 76 and 77 denote deposition shields that are freely attached and detached. The deposition shield 76 is provided along an inner wall surface of the processing chamber 1, and prevents an etching byproduct (deposition) from being attached to the processing chamber 1. A conductive member (GND block) 79 grounded in a direct-current manner is provided at almost the same height as that of the semiconductor wafer W in the deposition shield 76, and prevents an abnormal discharge.

An overall operation of the plasma etching apparatus configured as described above is controlled by the control unit 60. A process controller 61 which includes a CPU and controls each part of the plasma etching apparatus, a user interface 62, and a memory unit 63 are provided in the control unit 60.

The user interface 62 includes a keyboard by which a command is input in order for a process manager to manage the plasma etching apparatus, a display that visibly displays an operation state of the plasma etching apparatus, and so on.

A recipe of a control program (software) or processing condition data for enabling various processes executed in the plasma etching apparatus to be performed under the control of the process controller 61 is stored in the memory unit 63. Then, if necessary, a desired process is performed in the plasma etching apparatus under the control of the process controller 61 by reading an arbitrary recipe from the memory unit 63 according to an instruction or the like via the user interface 62 and executing the recipe in the process controller 61. Also, the recipe, such as the control program, the processing condition data, or the like may be one that is stored in a computer-readable storage medium (for example, a hard disc, a CD, a flexible disc, a semiconductor memory, or the like), or may be one that is transmitted any time through, for example, a dedicated line from another device and used online.

Next, structures of the through-holes 200 for lifter pins and the lifter pins 210 will be explained in detail with reference to FIG. 2. FIG. 2 schematically shows a configuration of the holding stage 2 of the plasma etching apparatus. The insulator 6b formed by a sprayed film or the like is formed on the top surface of the holding stage 2 including the base material 2a formed of a conductive metal such as aluminum or the like, and the electrode 6a for electrostatic chuck is disposed in the insulator 6b. The direct current power source 12 shown in FIG. 1 is connected to the electrode 6a.

Each of the lifter pins 210 includes a pin body part 211 having a typical pin shape and formed of insulating ceramics, resin or the like. The pin body 211 has an outer diameter of, for example, 3 mm. A lid part 212 having an outer diameter of, for example, 4 mm, greater than the outer diameter of the pin body part 211, having a circular disc shape, and formed of insulating ceramics, resin, or the like, like the pin body 211, is provided on a top portion of the pin body part 211. The lifter pins 210 are connected to a driving mechanism (not shown) and can protrude from and retreat into a surface (holding surface) of the holding stage 2 by moving vertically.

Meanwhile, each of the through-holes 200 for lifter pins formed in the holding stage 2 includes a pin body receiving part 201 and a lid receiving part 202 formed in an upper portion of the pin body receiving part 201. The pin body receiving part 201 has an inner diameter suitable for the outer diameter of the pin body part 211, that is, an inner diameter slightly greater (by, for example, 0.1 to 0.5 mm) than the outer diameter of the pin body part 211 and receives the pin body part 211 therein. A tube 203 formed of an insulating material such as ceramics or the like is disposed in the pin body receiving part 201, and covers an inner surface of the base material 2a, which is conductive, of the holding stage 2 with an insulating material.

The lid receiving part 202 has an inner diameter suitable for the outer diameter of the lid part 212, that is, an inner diameter slightly greater (by, for example, 0.1 to 0.5 mm) than the outer diameter of the lid part 212 and receives the lid part 212 therein. Also, the backside gas supply pipe 30 for supplying a helium gas for cooling or the like is provided in the holding stage 2 as described above.

As shown in FIG. 2(*a*), in a state where the lifter pins 210 are raised, front end portions of the lid part 212 and the pin body part 211 protrude from the surface (holding surface) of the holding stage 2 to support the semiconductor wafer W above the holding stage 2. Meanwhile, as shown in FIG. 2(*b*), in a state where the lifter pins 210 are lowered, the pin body part 211 is received in the pin body receiving part 201 and the lid part 212 is received in the lid receiving part 202. In this state, the upper portion of the pin body receiving part 201 is blocked by the lid part 212. That is, an outer circumferential portion of a lower surface of the lid part 212 contacts a bottom surface in the lid receiving part 202, and a space over the lid part 212 and a space under the lid part 212 are isolated from each other by the lid part 212.

As described above, in the present embodiment, when plasma processing is performed in a state where the lifter pins 210 are lowered and the semiconductor wafer W is held on the holding stage 2, the upper portion of the pin body receiving part 201 is blocked by the lid part 212. Accordingly, a discharge can be prevented from occurring between the semiconductor wafer W, and the base material 2a of the holding stage 2 or the peripheral structure of the base material 2a, and yield and productivity can be improved.

Figure 5:
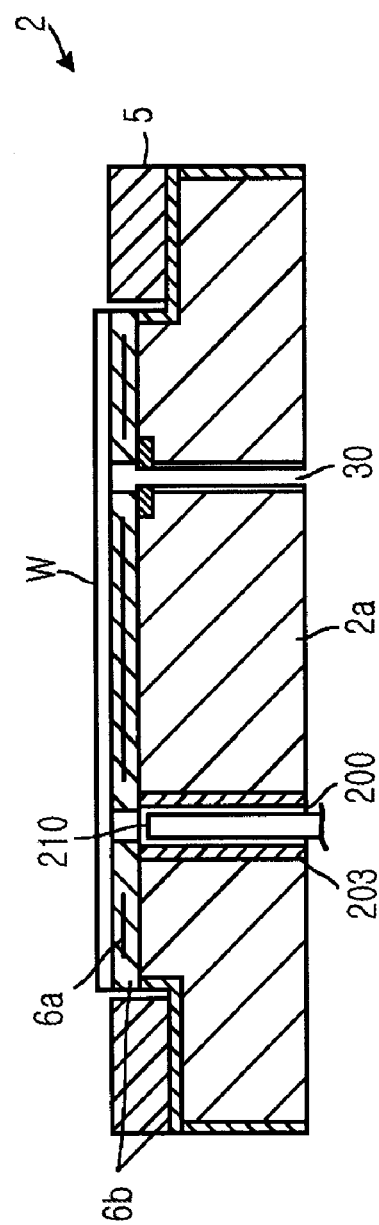
FIG. 5 is a view schematically showing a configuration of main parts of a conventional example.

That is, as shown in, for example, FIG. 5, in a state where the lifter pins 210 are lowered, if upper portions of the through-holes 200 for lifter pins are not blocked by the lid part or the like, a discharge may occur between the base material 2a of the holding stage 2 and the semiconductor wafer W, and the like through, for example, a gap between the tube 203 and the insulator 6b (formed of the sprayed film or the like) constituting the electrostatic chuck 6. In this case, a pressure in the through-holes 200 for lifter pins is changed, for example, when a helium gas for cooling is deeply introduced into the through-holes 200 for lifter pins. Accordingly, a value of P (pressure)×D (distance) which is a factor for causing a discharge in Paschen's Law is changed, thereby increasing the risk of a discharge.

Meanwhile, in the present embodiment, since the upper portion of the pin body receiving part 201 is blocked by the lid part 212 formed of an insulating material, the risk of a discharge can be reduced due to a physical structure. Also, since a pressure in the pin body receiving part 201 can be prevented from being changed, for example, when a helium gas for cooling is deeply introduced into the pin body receiving part 201, the risk of a discharge can be reduced.

Figure 3:
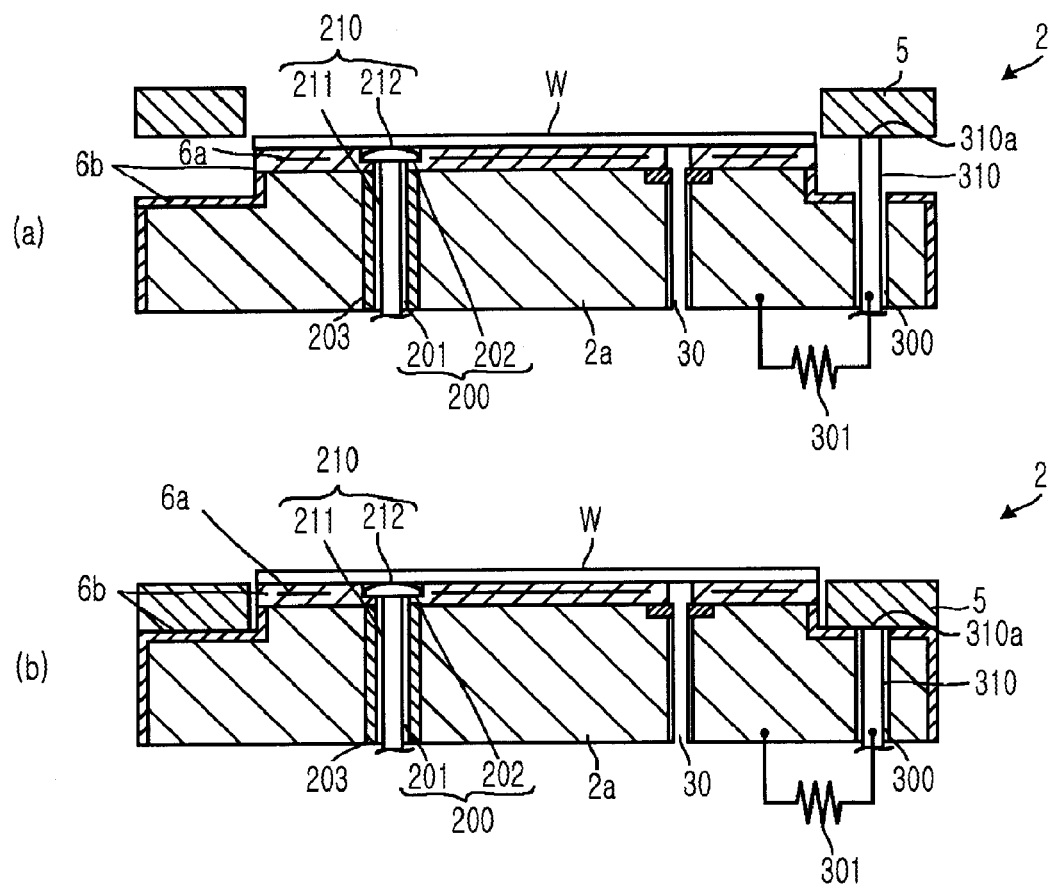
FIG. 3 is a view schematically showing a configuration of main parts according to a second embodiment of the present invention.

FIG. 3 schematically shows a configuration of the holding stage 2 of the plasma etching apparatus according to a second embodiment of the present invention. In the second embodiment, in addition to the lifter pins 210, a plurality of, for example, 3, lifter pins 310 for focus ring (only 1 lifter pin is shown in FIG. 3) for lifting and supporting the focus ring 5 above the holding stage 2 to exchange the focus ring 5 are provided.

The lifter pins 310 for focus ring are disposed in the through-holes 300 for lifter pins formed in the holding stage 2, and can move vertically by means of the driving mechanism (not shown). Then, in a state where the lifter pins 310 for focus ring are raised, the focus ring 5 is lifted and supported above the holding stage 2 as shown in FIG. 3(a), and in a state where the lifter pins 310 for focus ring are lowered, the focus ring 5 is held on the holding stage 2 as shown in FIG. 3(b).

The base material 2a of the holding stage 2 is formed of a conductive metal such as aluminum or the like, and the insulator 6b formed of the sprayed film or the like for constituting the electrostatic chuck is formed on the top surface of the holding stage 2. The focus ring 5 is held on the insulator 6b, and is typically electrically insulated from the base material 2a.

In the second embodiment, in a state where the lifter pins 310 for focus ring are lowered, top portions 310a of the lifter pins 310 for focus ring are set to contact a lower surface of the focus ring 5. Then, the focus ring 5 is electrically connected to the base material 2a of the holding stage 2 with the lifter pins 310 for focus ring and a resistance element 301 that is a current control element therebetween. A resistance value of the resistance element 301 is set so that a resistance to a direct current (DC) of a total circuit by which the focus ring 5 is connected to the base material 2a of the holding stage 2 may range from, for example, 20 MΩ to 200 MΩ.

A diameter of a portion of each of the lifter pins 310 for focus ring contacting the focus ring 5 and electrically connected to the focus ring 5 is much smaller compared to the semiconductor wafer W having a diameter of 300 mm or the focus ring 5 disposed along an outer circumference of the semiconductor wafer W. Then, while an electrically connected portion between the focus ring 5 and the base material 2a serves as a resistor with respect to a direct current, the electrically connected portion has a sufficiently high impedance with respect to high frequency waves applied to generate plasma and does not affect a high frequency wave transmission impedance (about several Ω) of the semiconductor wafer W and the focus ring 5.

As described above, the first RF power source 10a is connected through the first matcher 11a to the base material 2a of the holding stage 2, and the second RF power source 10b is also connected through the second matcher 11b to the base material 2a of the holding stage 2. Also, although polarization charges are generated between the electrode 6a of the electrostatic chuck 6 and the base material 2a of the holding stage 2, since a polarization potential is divided by a high frequency application circuit connected to the base material 2a, the polarization potential is determined by a high frequency application circuit constant and a chamber circuit constant.

As described above, in the second embodiment, the focus ring 5 and the base material 2a of the holding stage 2 are electrically connected to each other with the lifter pins 310 for focus ring and the resistance element 301 therebetween. Accordingly, a direct current flows according to a potential difference between the focus ring 5 and the base material 2a of the holding stage 2. The focus ring 5 and the base material 2a of the holding stage 2 may be electrically connected to each other by only one lifter pin 310 for focus ring or two or more lifter pins 310 for focus ring.

The semiconductor wafer W and the focus ring 5 exposed to plasma during plasma etching have almost the same potential (for example, up to about −2000 V) due to a self bias. Meanwhile, although the base material 2a of the holding stage 2 has a plus potential due to a direct current high voltage applied to the electrode 6a for the electrostatic chuck or the like, since the focus ring 5 and the base material 2a of the holding stage 2 are electrically connected to each other with the lifter pins 310 for focus ring and the resistance element 301 therebetween, in the second embodiment, a direct current flows through the focus ring 5 and the base material 2a of the holding stage 2.

Due to the direct current, a potential difference between the focus ring 5 and the base material 2a of the holding stage 2 can be reduced to, for example, about 500 V. That is, due to generation of the direct current, a potential of the base material 2a of the holding stage 2 gets similar to a potential of the focus ring 5. Accordingly, since a potential difference between the base material 2a of the holding stage 2 and the semiconductor wafer W is reduced, a discharge can be prevented from occurring between the semiconductor wafer W, and the base material 2a of the holding stage 2 or the peripheral structure of the base material 2a and yield and productivity can be improved. Of course, a discharge can be prevented from occurring between the focus ring 5, and the base material 2a of the holding stage 2 or the peripheral structure of the base material 2a.

Also, if the focus ring 5 and the base material 2a of the holding stage 2 are directly electrically connected to each other without interposing therebetween a current control element such as the resistance element 301 as described above, since an impedance of the focus ring 5 is smaller than that of the semiconductor wafer W when seen from plasma, plasma is formed in a doughnut shape over the focus ring 5 and thus affects plasma etching. Accordingly, if the resistance element 301 is used as a current control element, it is preferable that the focus ring 5 and the base material 2a of the holding stage 2 are electrically connected to each other with the resistance element 301 therebetween to have a total resistance value ranging from 20 MΩ to 200 MΩ as described above.

Figure 4:
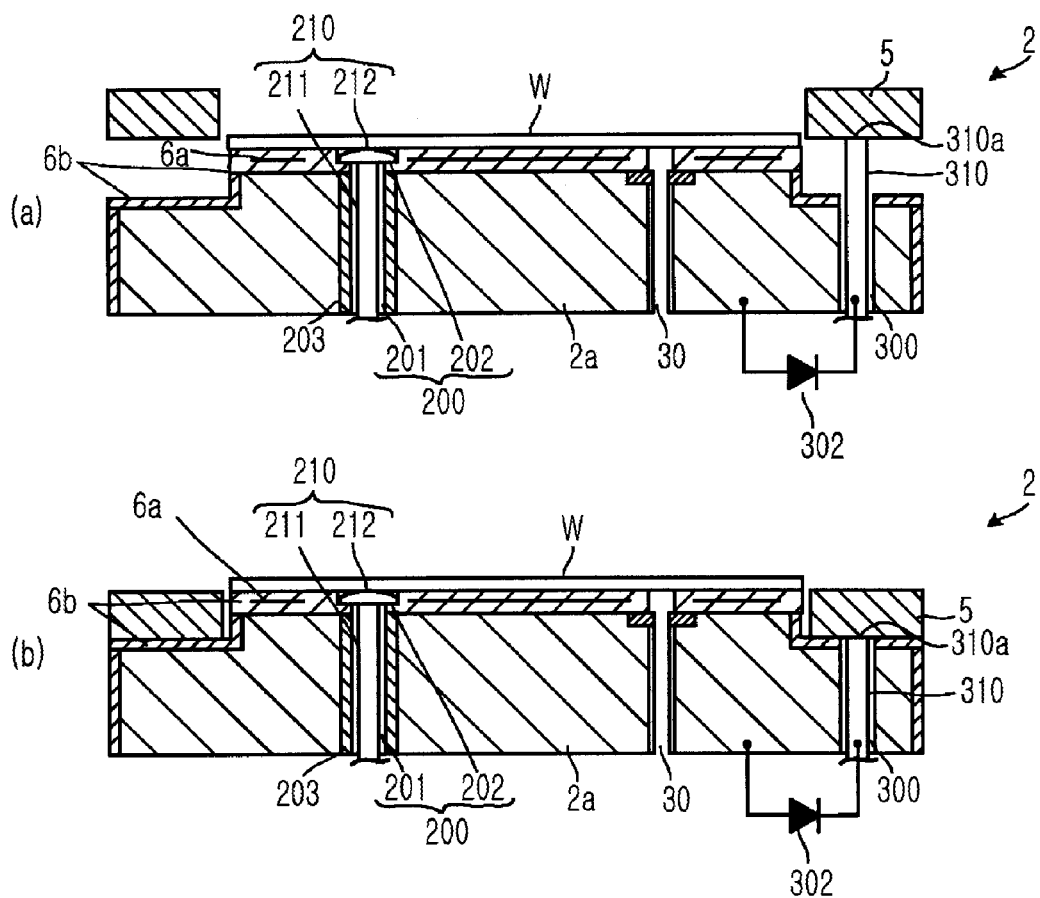
FIG. 4 is a view schematically showing a configuration of main parts according to a third embodiment of the present invention.

FIG. 4 shows a configuration using a Zener diode 302 instead of the resistance element 301 as a current control element according to a third embodiment of the present invention. If the Zener diode 302 is used, when a potential difference between the focus ring 5 and the base material 2a of the holding stage 2 gets equal to or higher than a predetermined level, a current flows through the Zener diode 302 and thus a potential difference between the focus ring 5 and the base material 2a of the holding stage 2 can be controlled to a predetermined value (for example, about 500 V). Also, even when the Zener diode 302 is used, a resistance element needs to be connected in series to the Zener diode 302 according to a capacity of the Zener diode 302.

As such, if a potential difference between the focus ring 5 and the base material 2a of the holding stage 2 can be controlled to a predetermined value, a discharge can be prevented from occurring between the semiconductor wafer W, and the base material 2a of the holding stage 2 or the peripheral structure of the base material 2a, and a change of a potential difference between the semiconductor wafer W, and the base material 2a of the holding stage 2 or the peripheral structure of the base material 2a can be prevented from affecting plasma etching.

Next, an order in which a silicon oxide film or the like formed on the semiconductor wafer W is plasma-etched by using the plasma etching apparatus configured as described above will be explained. First, the gate valve 75 is opened, the semiconductor wafer W is transferred into the processing chamber 1 through the transfer in/out port 74 from a load-lock chamber (not shown) by a transfer robot or the like (not shown), and is held on the holding stage 2. Next, the transfer robot is retracted from the processing chamber 1, and the gate valve 75 is closed. Then, a gas is discharged from the processing chamber 1 through the exhaust port 71 by the vacuum pump of the exhaust device 73.

After the inside of the processing chamber 1 is depressurized to a predetermined degree of vacuum, a predetermined process gas (etching gas) is introduced from the process gas supply source 15 into the processing chamber 1 to keep the inside of the processing chamber 1 at a predetermined pressure, and in this state, high-frequency power of, for example, 40 MHz, is supplied to the holding stage 2 from the first RF power source 10a. Also, high-frequency power (for bias) of, for example, 3.2 MHz, is supplied to the base material 2a of the holding stage 2 from the second RF power source 10b in order to drag ions. At this time, a predetermined direct voltage (for example, a direct voltage of, for example, +2500 V) is applied to the electrode 6a of the electrostatic chuck 6 from the direct current power source 12, and the semiconductor wafer W is adsorbed onto the electrostatic chuck 6 due to a Coulomb force.

In this case, since high-frequency power is applied to the holding stage 2 that is a lower electrode as described above, an electric field is formed between the shower head 16 that is an upper electrode and the holding stage 2 that is a lower electrode. A discharge occurs in a processing space in which the semiconductor wafer W exists, and due to plasma of a process gas generated by the discharge, a silicon oxide film or the like formed on the semiconductor wafer W is etched. During this plasma etching, a discharge can be prevented from occurring between the semiconductor wafer W, and the base material 2a of the holding stage 2 or the peripheral structure of the base material 2a as described above, in the present embodiment.

Also, as described above, since a direct voltage can be applied to the shower head 16 during plasma processing, the following effects can be achieved. That is, plasma having high electron density and low ion energy may be required according to processes. In this case, if a direct voltage is used, since energy of ions injected into the semiconductor wafer W is suppressed and electron density of plasma is increased, an etching rate of a film of the semiconductor wafer W to be etched is increased and a sputter rate of a film, which is formed on the film to be etched and serves as a mask, is reduced, thereby improving selectivity.

Also, after the etching ends, supply of high-frequency power, supply of a direct voltage, and supply of a process gas are stopped and the semiconductor wafer W is transferred out of the processing chamber 1 in an order reverse to that described above.

According to the plasma processing apparatus and the manufacturing method of a semiconductor device of the present invention, a discharge can be prevented from occurring between a wafer, such as a semiconductor wafer, and a base material of a lower electrode or a peripheral structure of the base material, and yield and productivity can be improved.

As described above, according to the above embodiments, a discharge can be prevented from occurring between a semiconductor wafer, and a base material of a holding stage (lower electrode) or a peripheral structure of the base material, and yield and productivity can be improved. Also, the present invention is not limited to the above embodiments and various modifications can be made.

What is claimed is:
1. A plasma processing apparatus comprising:
processing chamber;
a lower electrode which is provided in the processing chamber, comprises a base material which is formed of a conductive metal and to which high-frequency power is applied, and serves as a holding stage on which a substrate to be processed is held;
an upper electrode which is provided in the processing chamber to face the lower electrode;
a plurality of lifter pins which freely protrude from and retreat into a top surface of the lower electrode and support the substrate over the lower electrode;
a focus ring which is disposed on the lower electrode to surround the substrate;
a lifter pin for focus ring which contacts the focus ring, is electrically connected to the focus ring, moves vertically and supports the focus ring over the lower electrode; and
an electrical connection mechanism which electrically connects between the base material of the lower electrode and the focus ring with the lifter pin for focus ring and a current control element therebetween, and generates a direct current according to a potential difference,
wherein each of the lifter pins comprises a pin body part and a lid part which is disposed on a top portion of the pin body part and has an outer diameter greater than an outer diameter of the pin body part;
the lower electrode comprises through-holes for lifter pins each of which comprises a pin body receiving part, which has an inner diameter less than the outer diameter of the lid part, has an inner surface covered with an insulating material, and receives the pin body part via the insulating material, and a lid receiving part, which is formed in an upper portion of the pin body receiving part and receives the lid part, and in which the lifter pins are disposed; and in a state where the lifter pins are lowered, the lid part is received in the lid receiving part such that an upper surface of the lid part and an upper surface of the lower electrode surrounding the lid part are placed at the same height, and the upper portion of the pin body receiving part is blocked by the lid part.

2. The plasma processing apparatus of claim 1, wherein the current control element comprises a resistance element.

3. The plasma processing apparatus of claim 2, wherein the resistance element is configured such that the base material of the lower electrode and the focus ring are electrically connected to each other with a resistance value of 20 M$\Omega$ to 200 M$\Omega$.

4. The plasma processing apparatus of claim 1, wherein the current control element comprises a Zener diode.

* * * * *